United States Patent [19]

Zuleeg

[11] Patent Number: 4,746,627
[45] Date of Patent: May 24, 1988

[54] METHOD OF MAKING COMPLEMENTARY GAAS HETEROJUNCTION TRANSISTORS

[75] Inventor: Rainer Zuleeg, San Juan Capistrano, Calif.

[73] Assignee: McDonnell Douglas Corporation, Long Beach, Calif.

[21] Appl. No.: 924,883

[22] Filed: Oct. 30, 1986

[51] Int. Cl.[4] .................. H01L 21/263; H01L 21/26; H01L 21/203

[52] U.S. Cl. ...................................... 437/126; 357/42; 437/22; 437/34; 437/132; 437/133

[58] Field of Search ............... 29/571, 576 B; 148/1.5, 148/175, 187; 357/42; 437/126

[56] References Cited

U.S. PATENT DOCUMENTS

| 4,452,646 | 6/1984 | Zuleeg | 148/1.5 |
| 4,523,961 | 6/1985 | Hartman et al. | 148/1.5 |
| 4,568,957 | 2/1986 | Zuleeg et al. | 357/42 |
| 4,603,469 | 8/1986 | Armiento et al. | 29/571 |
| 4,635,343 | 1/1987 | Kuroda | 29/576 B |
| 4,662,058 | 5/1987 | Crillo, Jr. et al. | 29/571 |

OTHER PUBLICATIONS

Drummond et al., Thin Solid Films 123 (1985) 213.
Kiehl et al., IEEE-Electron Device Letts. EDL-5 (1984) 521.
Solomon et al., IEEE-Electron Device Letts. EDL-5 (1984) 379.

Primary Examiner—Upendra Roy
Attorney, Agent, or Firm—Gregory A. Cone; George W. Finch; Donald L. Royer

[57] ABSTRACT

A complementary GaAs Transistor pair is formed of a p-type MODFET and an n-type FET having an ion-implanted channel doping with a heterojunction gate. One set of structures is implemented in a planar process utilizing molecular beam epitaxy. The p-MODFET threshold voltage is determined by the thickness and doping of the p-AlGaAs layer plus the Schottky barrier height of the metal gate, and the ion implantation dosage is adjusted to give the proper threshold voltage for the enhancement mode n-channel heterojunction FET.

9 Claims, 3 Drawing Sheets

METHOD OF MAKING COMPLEMENTARY GAAS HETEROJUNCTION TRANSISTORS

BACKGROUND OF THE INVENTION

This invention relates to III-IV compound semiconductor devices implemented in planar processing to form complementary transistor logic structures. More particularly, this invention relates to the combination of a p-MODFET structure combined wit an enhancement mode n-channel heterojunction FET.

Gallium arsenide field effect transistors are rapidly emerging as a serious competitor to the more mature silicon microelectronic technologies, especially in the areas of low power logic circuits. Gallium arsenide is especially attractive because of the very high electron mobility compared to that found in silicon. Unfortunately, the hole mobility in gallium arsenide is similar to that found for holes in silicon. Therefore the design of complementary gallium arsenide logic circuits suffers in speed due to this low hole mobility. The low value of hole mobility results in low p-channel transconductance which produces low switching speeds. The p-channel transconductance obtained in complementary circuits based on gallium arsenide JFETs is only five mS/mm compared to about fifty to one hundred mS/mm for the n-channel transconductance.

It has recently been demonstrated that the mobility of holes can be drastically improved by the use of a p-(Al,Ga) As/i-GaAs modulation doped heterostructure. The mobilities of holes in these structures at moderately low temperatures are comparable to those of electrons in bulk gallium arsenide MESFET's. Such p-MODFET structures have yet to be successfully combined with a complementary n-channel structure in terms of a planar technology which can reliably produce complementary gallium arsenide logic devices having uniform voltage thresholds and reliable operating characteristics.

SUMMARY OF THE INVENTION

A complementary gallium arsenide transistor structure is formed by a molecular beam epitaxy process to produce a structure which is capable of operation at very low power levels and very high speeds at either room temperature or, even more desirably, lower temperatures (77K). The structure combines a p MODFET with an enhancement mode n-channel heterojunction FET. The fabrication process for a first embodiment is basically as follows. First lay down a first layer of intrinsic gallium arsenide onto a first surface of a gallium arsenide (or silicon) semi-insulating wafer by molecular beam epitaxy (MBE). Then lay down a second layer of undoped aluminum gallium arsenide, then lay down a third layer of p-type aluminum gallium arsenide, then lay down a fourth capping layer of p+ aluminum gallium arsenide. The channel region for the n-type transistor is then established by ion implantation of n-type impurity ions through another layer of silicon nitride to establish the channel in the first layer of gallium arsenide adjacent the second layer of undope aluminum gallium arsenide. The fifth layer (silicon nitride) is then stripped away and the gate electrodes are implaced for both the n- and the p-type transistors utilizing a refractory metal compound. The source and drain regions for the n- and p-type transistors are established by further ion implantation of n- and p-type impurities respectively through another layer of silicon nitride. The structure is then annealed and finally electrode metallizations are emplaced atop the appropriate regions of the n- and p-type source and drains to complete the structure of the complementary transistor pair.

A second embodiment produces mesa-type structures for the complementary pair with similar processing steps.

DETAILED DESCRIPTION OF THE INVENTION

Figure 1:
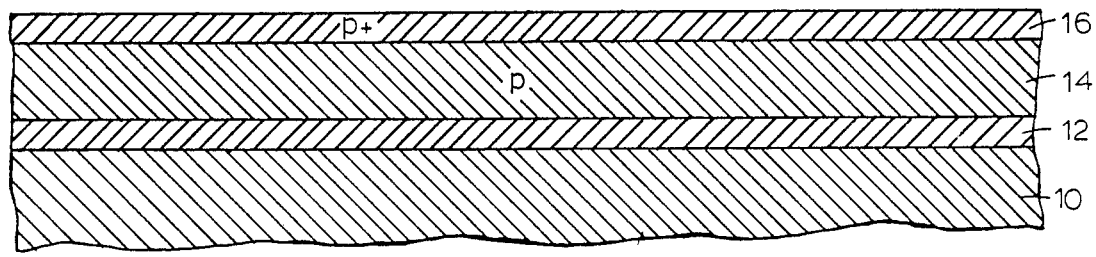
FIG. 1 is a cross-sectional view of an early step in the processing sequence to produce the planar pair of complementary transistors.

The modulation doped FET (MODFET) has emerged as a potential candidate for very high speed circuits. The unique feature of the initial MODFET heterostructure has been the high electron mobility produced by the separation of the electron spatially from the electrons supplying donors. Nevertheless, the original device has some deficiencies which limit its application to integrated circuit fabrication. The properties of concern are the threshold voltage control over large wafer areas (which determines the processing and circuit yield at high circuit complexity) and the charge trapping problems associated with the doped aluminum gallium arsenide layer, which leads to device and circuit instabilities and light sensitivity. All of these problems can be eliminated with a gallium arsenide gate heterojunction FET still retaining the modulation doping feature. This semiconductor-insulator-semiconductor FET consists of a heavily doped n-type gallium arsenide gate with undoped aluminum gallium arsenide as the gate insulator on an undoped gallium arsenide layer. This structure gives the device a threshold voltage near zero and is therefore well suited for low voltage directly coupled FET logic (DCFL). The threshold voltage of this MODFET is given by:

$$V_T = \phi_1 - \phi_2 - qNa^2/2\epsilon\epsilon_o \quad (1)$$

where the barrier heights $\phi_1$ and $\phi_2$ are different for a standard structure GaAs (undoped)/AlGaAs (undoped)/AlGaAs (doped), but are almost equal for the GaAs (undoped)/AlGaAs (undoped)/GaAs (doped) structure due to the material symmetry, that is except for a small difference arising from the different positions of the Fermi level with respect to the conduction band in the gate compared to the channel. N-type devices utilizing MBE (molecular beam epitaxy) growth and self-alignment with ion implantation and rapid annealing have demonstrated transconductance of 240 mS/mm and field-effect mobility of about 100,000 cm$^2$/Vs at 77K. Redesign of the structure allows for the construction of a p-type MODFET. At room temperature the mobility of the holes improves from about 300 to about 350 cm$^2$/Vs with present homojunction p-type JFETS to about 800 to 1000 cm$^2$/Vs for the heterojunction p-MODFET. Cooling to 77K produces a two dimensional hole gas mobility of about 5,000 cm$^2$/Vs.

The best performance for integrated circuits utilizing this technology would probably be obtained from a combination of self aligned n and p MODFET devices on the same substrate. However, the fabrication sequence after the undoped AlGaAs layer is grown requires a selective masking or etching to grow the n+--GaAs and +--GaAs layer for the respective MODFETs. This can only be done by interrupting the MBE growth to allow for one masking and/or etching processing step outside the MBE chamber and then re-starting the second GaAs layer growth. Hence although the production of self-aligned n and p MODFET devices on the same wafer is theoretically possible, they cannot now be realized with existing MBE technology without introducing in one structure undesirable interface states which prohibit good threshold voltage control. One solution has been to combine a p MODFET and an n-heterojunction barrier MESFET as described in IEEE Electronic Device Letters, volume EDL-5, no. 12, December, 1984 at page 521 by R. A. Kiehl and A. C. Gossard. Nevertheless, the chemical etching of the windows and recessed gate geometries of this design make this approach undesirable for high yield large scale integration. This reference does not utilize a planar geometry, and the threshold voltages are difficult to control.

To overcome both of these difficulties and provide an economical process in planar fabrication approach, I have invented the present structure which comprises a self-aligned enhancement mode GaAs gate p-MODFET and an ion implanted enhancement mode n-type heterojunction FET. This design takes advantage of only 2 MBE layers, namely undoped AlGaAs and doped p+ GaAs, to form in a planar process the p MODFET and the n heterojunction FET. The threshold voltage of the p MODFET is controlled by the MBE growth, and the threshold voltage of the complementary n-channel HJFET is independently controlled by the ion implanted channel. Therefore the highest mobility for the p-channel device and the complementary heterojunction n-channel device is obtained with reasonable high mobility at room temperature when compared to the standard complementary JFET technology already developed by the inventor for the assignee of this invention. This complementary JFET technology is more completely described in U.S. Pat. No. 4,568,957 which issued to Rainer Zuleeg, J. K. Notthoff and G. L. Troeger for "GaAs Complementary Enhancement Mode Junction Field Effect Transistor Structures and Method of Fabrication." This patent is incorporated herein by reference in its entirety. As an additional improvement over this complementary JFET technology, the heterojunction allows for a higher forward bias operation, that is 1.5 volts compared to 1.0 volts, and thus results in higher noise margins. This in turn results in a higher processing yield due to the higher supply voltage operation.

The fabrication processes for the complementary structures are shown in FIGS. 1 through 10. The planar fabrication process is illustrated in FIGS. 1 through 7, while FIGS. 8, 9 and 10 display portions of the mesa structure processing technique. The planar process will be described first and in more detail. The mesa structure process will produce devices with reduced sidewall capacitances for both devices by the use of one additional etching step. The mesa structure still retains the self alignment feature for the ion implantation steps.

FIG. 1 shows a portion of the larger wafer sized semiconductor disc on which a large plurality of complementary transistors and other related structures would be emplaced. The processing begins with the substrate 10 which can be either silicon or gallium arsenide. The three layers 12, 14 and 16 are then emplaced atop the substrate by molecular beam epitaxy. Layer 12 is undoped aluminum gallium arsenide approximately 50-100 Angstroms thick. Layer 14 is aluminum gallium arsenide with p-type impurity ions about 300-500 Angstroms thick. The top layer 16 is gallium arsenide with a more concentrated population of p impurities about 100-200 Angstroms thick. Layers 14 and 16 are additionally labelled p and p+ respectively to indicate their impurity concentration levels. An additional thin MBE layer, not shown, of intrinsic GaAs may be emplaced between the substrate 10 and the undoped AlGaAs layer 12.

Figure 2:
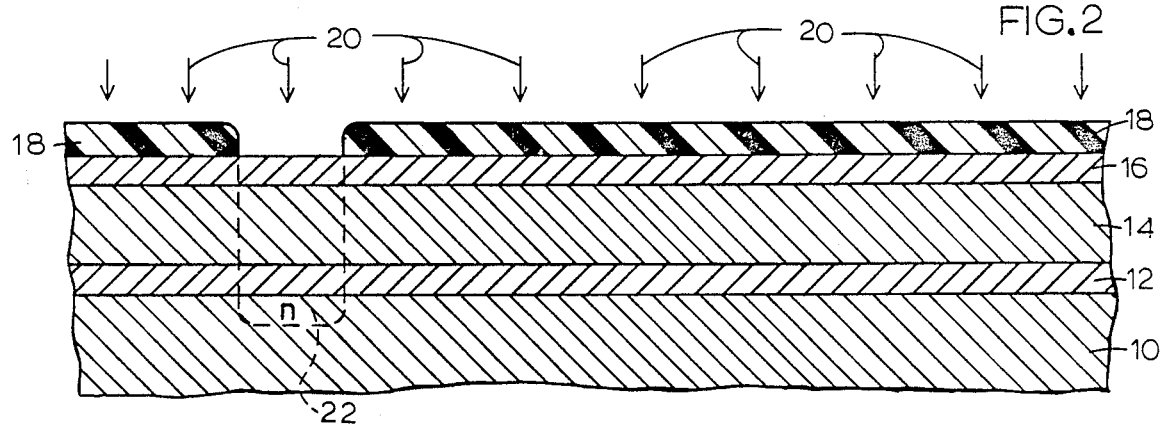
FIG. 2 is a cross-sectional view of a succeeding step in the planar process showing the n impurity ion implantation step.

FIG. 2 is another cross sectional view of the region of the wafer in which a complementary pair of transistors would be formed showing a later processing step in the sequence. Here a photoresist layer 18 has been laid down on top of the layer 16, a window has been opened in it, and an ion implantation step is being conducted. The ion implantation is indicated by the downwardly directed arrows labelled 20 which introduce the n type impurity ions through the layers 16, 14, 12 and down into the substrate 10 to create the n channel region 22 as shown. This is the first step in the formation of the n-HJFET structure, the channel ion implantation step. The implantation is done by selectively implanting Si+ through openings in the photoresist mask as shown, removing the photoresist, and then annealing the structure to activate the ion implantation in the region 22. The implementation can also be done through a thin layer (500-1000 Angstroms) of Si$_3$N$_4$.

Figure 3:
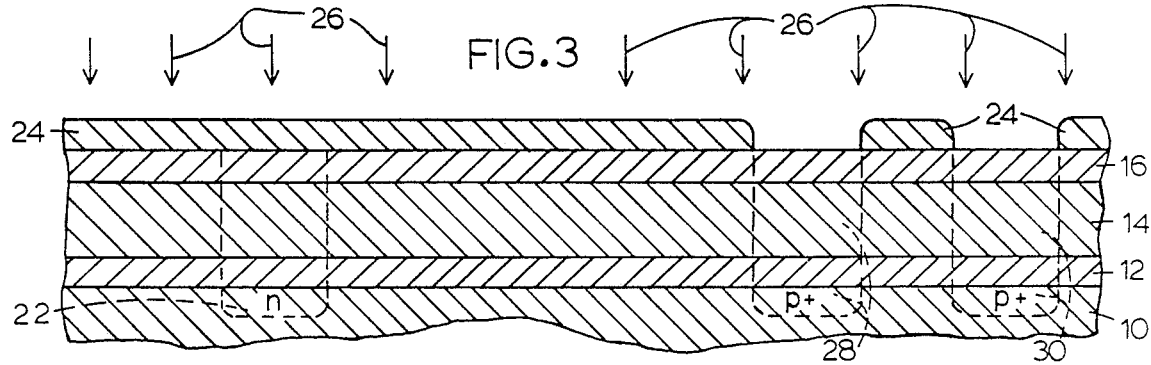
FIG. 3 is a view of succeeding step showing the p+ ion implantation step to form the source and drain regions of the other transistor in the pair.

FIG. 3 shows a succeeding step in the processing sequence for the complementary planar transistor pair. Here a refractory metal layer 24 has been emplaced atop the layer 16, windows have been etched out of this layer 24 as shown, and another ion implantation step is being conducted. The ion implantation here is indicated by the arrows 26 which form the p+ regions 28 and 30 as shown through the layers 16, 14, 12 into the substrate 10. Region 28 will be the source region and region 30 will be the drain region for the p-MODFET. As before, after the ion implantation of the p+ concentration implant is finished, an annealing step will be conducted in order to activate the p+ regions 28 and 30.

Figure 4:
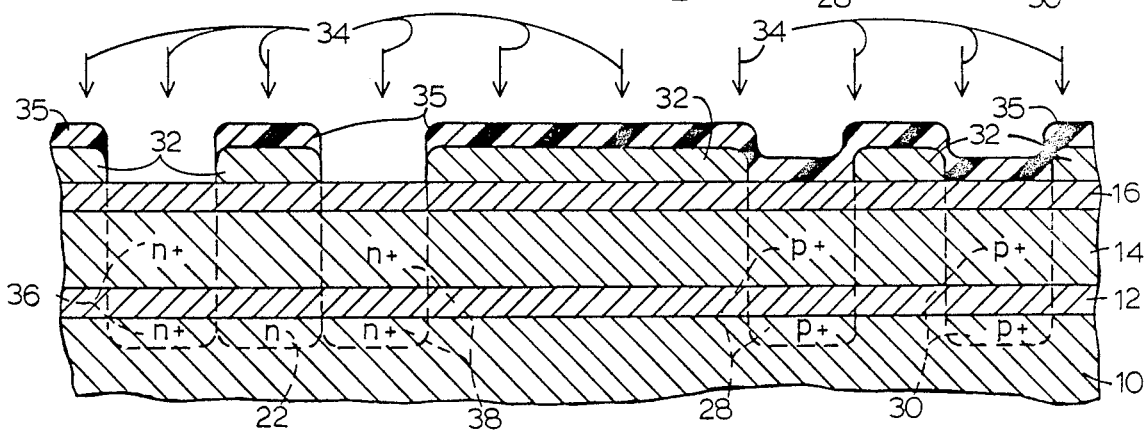
FIG. 4 is another succeeding step in the processing sequence showing the implantation of the n+ impurities to form the source and drain regions on either side of the earlier n implantation feature shown in FIG. 2.

FIG. 4 is similar to the processing step shown in FIG. 3 in that additional windows are opened up in the refractory metal layer, here labeled 32, to enable the ion implantation of n type impurity ions into the regions 36 and 38 to form the source and drain regions of the n-HJFET. Prior to the implantation step, a layer of photoresist is emplaced atop the refractory metal layer to shield all but the regions 36 and 38 from the ion implantation of the n type impurities. The n type impurity concentration here is higher than in the channel region 22 and is so indicated by the n+ labelling.

Figure 5:
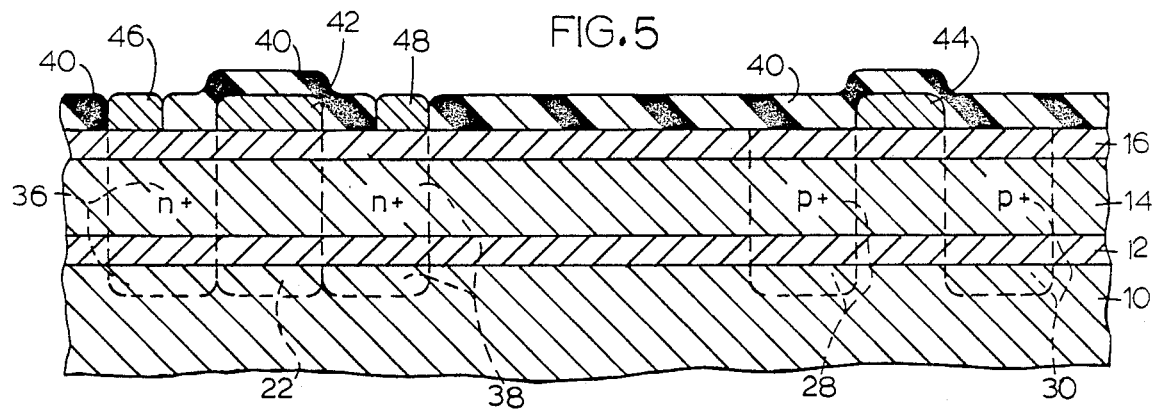
FIG. 5 is a succeeding step showing the emplacement of the source and drain electrical contacts to the n channel transistor.

FIG. 5 shows a succeeding step in the planar processing sequence to form the complementary transistor pair. This particular step shows the emplacement of the ohmic contacts for the source and drain regions 36 and 38 for the n-HJFET. These ohmic contacts are desirably formed of AuGeNi by a conventional photoresist lift process. Prior to this step, all of the refractory metal layer has been removed except for the isolated regions 42 and 44 which form metal contacts over the channel regions of the n-HJFET and the p-MODFET as shown.

Figure 6:
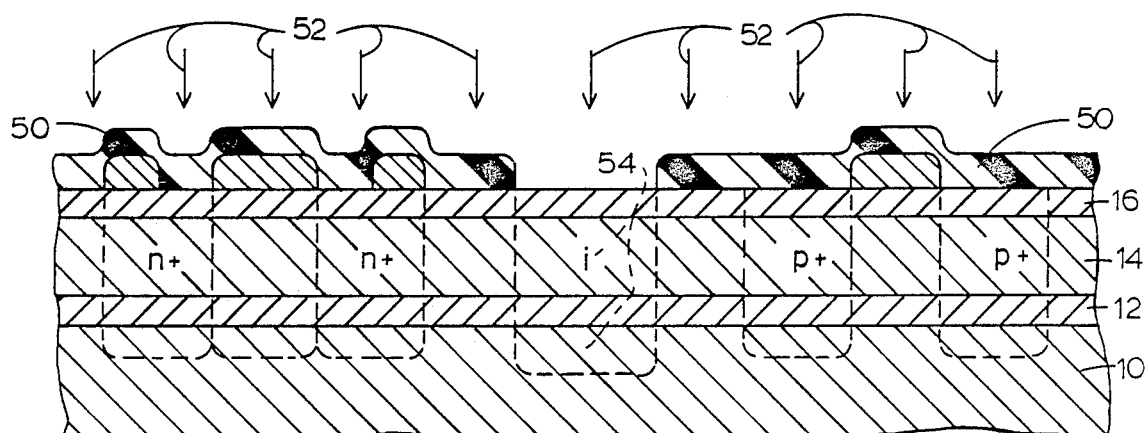
FIG. 6 is a succeeding step showing the proton bombardment step which forms an intrinsic, high resistivity region between the two transistors.

FIG. 6 shows another succeeding step in the process. This is a proton bombardment step to electrically isolate the two transistor structures one from another. In this step another layer of photoresist 50 has been laid down on top of the structure. A window is opened up in the photoresist layer exposing the layer 16. The proton bombardment is then conducted into the region 54 which acts to form a high resistivity region between the two transistor structures, labelled i or intrinsic, as shown.

Figure 7:
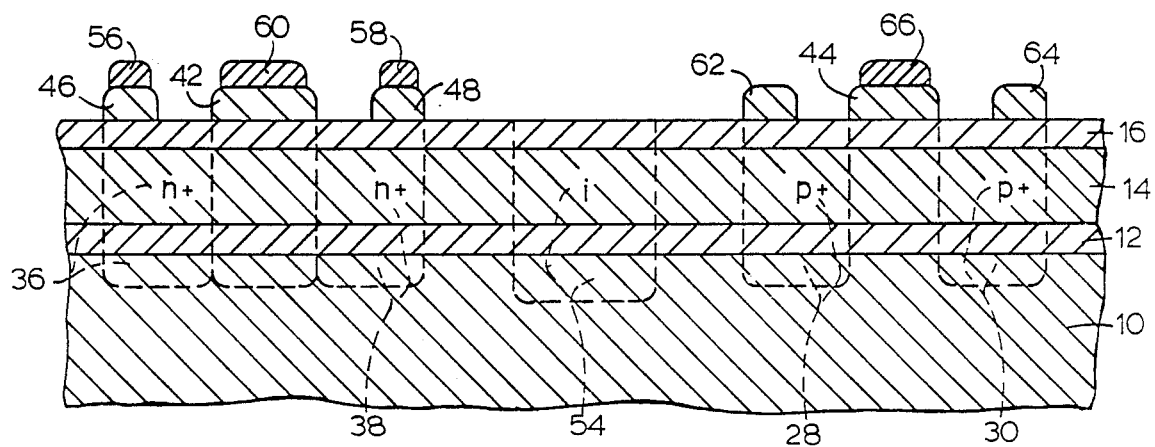
FIG. 7 is a succeeding step in the planar processing showing the emplacement of the final electrical contacts onto the transistor devices.
Figure 8:
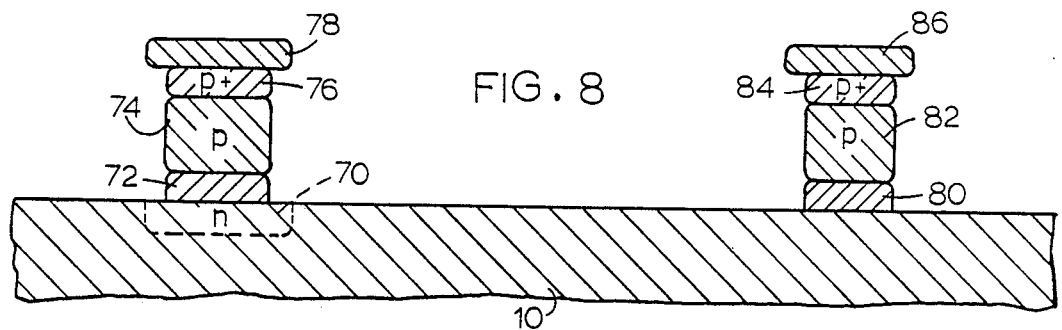
FIG. 8 shows an early step in the processing sequence to form mesa structures for the complementary transistor pair.

FIG. 7 shows one of the final steps in the processing sequence for the planar structures. In this step an overlay contact layer of AuPt has been emplaced atop the various areas as shown. Going from left to right, overlay metal contacts have been made on the n-HJFET as shown. There is an overlay 56 over the source ohmic contact 46, an overlay contact 60 over the channel contact 42, and an overlay contact 58 over the drain ohmic contact 48. For the p-MODFET there is an ohmic contact 62 over the source region 28, an overlay contact 66 over the channel contact 44, and an ohmic contact 64 over the drain region 30. Again, the contacts labelled 62, 64 and 66 are the overlay metal, AuPt. This overlay metal emplacement would also constitute the first interconnect level between devices; however, no interconnects are shown in this view.

As was mentioned briefly above, this same technique can be modified into a non planar-mesa structure processing sequence. The first steps are the same as in process one in which a sequence of operations is conducted to bring one to a point somewhere between that shown in FIG. 2 and FIG. 3 in that the three layers have been emplaced atop a substrate 10, the first undoped aluminum gallium arsenide layer, then the p doped aluminum gallium arsenide layer, and finally the top p+ doped gallium arsenide layer, all emplaced by MBE processing. The next step would be to implant the n impurity region 70 into the substrate as shown by ion implantation techniques as were conducted in the steps shown in FIG. 2. After this, a refractory metal layer would have been emplaced atop the structure and then selectively etched away to form the two mesa structures shown in FIG. 8. The refractory metal layers 78 and 86 are somewhat more resistant than the underlying layers atop the substrate 10, thus forming the mesa-like or mushroom structures shown in FIG. 8. These vertical structures form the gate regions for the two complementary transistor devices. The layers underneath the refractory metal capping layer 78 for the n-HJFET are, from top to bottom, the p+ gallium arsenide layer 76, the p-aluminum gallium arsenide layer 74, and the undoped aluminum gallium arsenide layer 72. The mesa structure over the gate region for the p-MODFET is capped with a refractory metal electrode layer 86. Underneath it going from top to bottom are the p+ −gallium arsenide layer 84, the p-aluminum gallium arsenide layer 82 and the undoped aluminum gallium arsenide layer 80.

Figure 9:
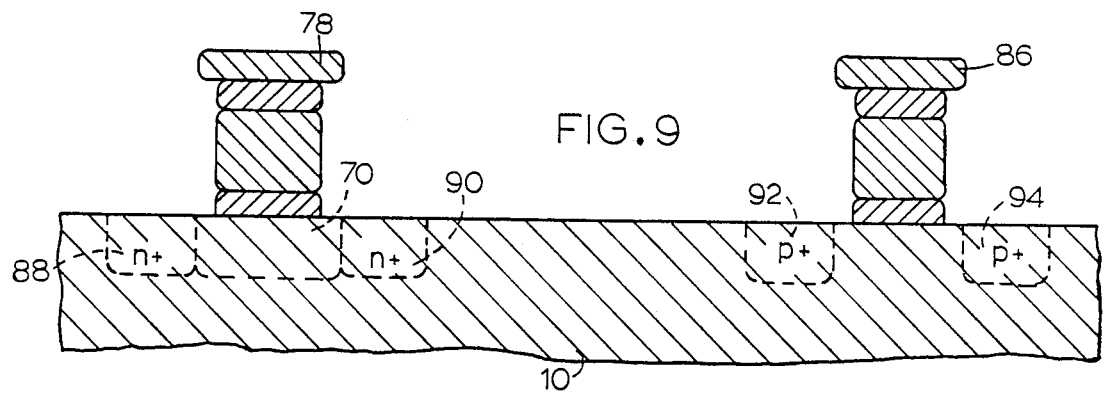
FIG. 9 is a succeeding step in the mesa processing sequence showing the n+ ion implanted regions in the n channel transistor and the p+ implantations for the p MODFET.

A succeeding step is shown in FIG. 9. Here a masking step has been conducted for the selective ion implantation of the n+ and p+ regions, which are self-aligned by the mesa structures designated by the numbers 78 and 86 which label the refractory metal capping layers for these structures. The actual ion implantation regions are shown as 88 and 90 which will be the source and drain regions for the n-HJFET. The p+ regions 92 and 94 will be the source and drain regions respectively for the p-MODFET.

Figure 10:
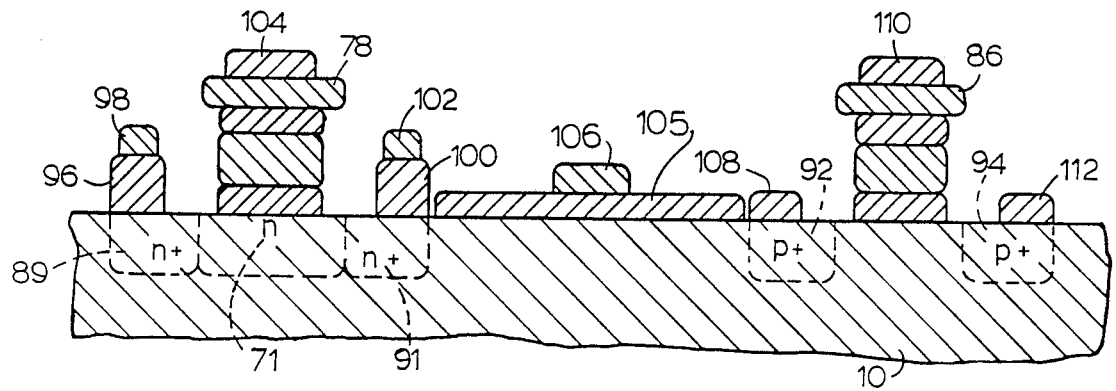
FIG. 10 is a succeeding step in the processing sequence for the mesa structure devices showing the final electrical contacts implaced atop the mesa structures and also an interconnect conduction path.

FIG. 10 shows a final step in the processing sequence for the mesa structures. After the step shown in FIG. 9, the AuGeNi contacts were emplaced on the n-HJFET structure by the same method as was utilized in FIG. 5. The proton bombardment implantation shown in FIG. 6 for the planar process is not necessary here because the conductive layers atop the substrate 10 had already been etched off everywhere but under the gate regions. Next a mask was emplaced and the overlay metal, AuPt, was emplaced atop the AuGeNi contacts to form ohmic contacts to the p+ regions of the p-MODFET. Annealing steps were also conducted at appropriate times to activate the n+ regions 89 and 91 and the p+ regions 92 and 94 as shown. Taking the n-HJFET structure first, the substrate 10 contains the n+ source region 89, the n-channel region 71 and the n+ drain region 91. Atop the source region 89 is the ohmic contact 96 and its overlay metal electrode 98. The mesa structure atop the channel or gate region is capped by the refractory metal layer 78 which is in turn overlayed with the overlay metal layer 104. The drain region 91 has its own ohmic contact 100 which is capped by the overlay metal layer electrode 102. For the p-MODFET structure, the source region 92 is capped by its overlay metal electrode 108. The central gate region is capped by its refractory metal layer 86 which is in turn overlayed with the overlay metal layer 110 to form the gate electrode. The drain region 94 is capped with the overlay metal electrode 112. In between the two structures is an interconnect 106 formed of the overlay metal material (AuPt), on top of a layer of dielectric material 105, preferably $Si_3N_4$ to electrically isolate the interconnect 106 from the substrate 10.

Turning now to detailed process specifications, the annealing steps are generally conducted at about 800° C. for somewhere between one and ten minutes. For the $Al_xGa_{1-x}As$ layers, x is equal to or greater than about 0.3. For the p-MODFET device, a threshold voltage of about 0.2 volts is achieved by a doping concentration of $1 \times 10^{17} cm^{-3}$ for a thickness of 500 Angstroms. The n type ion implantation into the channel regions is conducted in one embodiment with $Si^+$ ions implanted at 100–200 Kev in a dose range of $2-5 \times 10^{12}$ atoms/cm$^2$. With proper activation of the ion implanted impurities, a peak doping level of $0.5 \times 10^{17}$ cm$^{-3}$ and a channel heighth of 1000 Angstroms and a threshold voltage of 0.4 volts results. The ion species for the n type ions is preferably Si$^+$, although Se$^{30}$, S$^+$ or Sn$^+$ could also be used.

The source and drain ion implantations for the n-HJFET were done at 100–150 Kev and 50–75 Kev in two separate implantations with a dose of $1-2 \times 10^{13}$ cm$^{-2}$. The source and drain ion implants for the p-MODFET were done with zinc ions at 50 Kev and a dose of $5 \times 10^{14}$ cm$^{-2}$. This gives a peak concentration of $3-5 \times 10^{19}$ cm$^{-3}$ with an average width of 50 to 1000 Angstroms. The p-type implantation worked best when annealed by a rapid thermal process at 800° C. for 1–2 seconds. For the p-type implantations, zinc is preferred, but magnesium and berrylium can also be used.

I claim:

1. A planar process for fabricating at least one n-type MESFET transistor and at least one p-type MODFET transistor comprising:
    forming a first layer of intrinsic GaAs of a thickness of from about 1 to about 5 microns on a first surface of a semi-insulating wafer by molecular beam epitaxy (MBE);
    forming a second layer of updoped AlGaAs of a thickness of from about 50 to about 100 Angstroms atop the first layer by MBE;
    forming a third layer of p-type AlGaAs of a thickness of from about 300 to about 500 Angstroms atop the second layer by MBE;
    forming a fourth cap layer of p+ AlGaAs having a p-type impurity concentratin of about 10$^{18}$cm$^{-3}$ atop the third layer by MBE;
    establishing the channel region of the n-type transistor by ion implantation of n-type impurity ions through a fifth layer of Si$_3$N$_4$ of about 500 to about 1,000 Angstroms thickness to establish the channel in the first layer of gallium arsenide;
    striping away the fifth layer;
    laying down gate electrodes of a refractory metal compound for the n- and p-type transistors;
    establishing source and drain regions for the n- and p-type transistors by ion implatation of respective n- and p-type impurities through a sixth Si$_3$N$_4$ layer having an effective thickness similar to the fifth layer;
    annealing the structure at about 800° C. for about 1–10 minutes; and
    depositing electrode metallizations atop the respective source and drain regions of the n- and p-type transistor.

2. The process of claim 1 wherein the wafer is a silicon wafer.

3. The process of claim 1 wherein the wafer is a GaAs wafer.

4. The process of claim 1 wherein the relative proportions of Al and Ga in the AlGaAs layers are defined by the formulate Al$_x$Ga$_{1-x}$As where x is at least 0.3.

5. The process of claim 1 further including a proton bombardment step in which protons of sufficient energy to form a high resistivity region are introduced into and through all of the layers overlaying the semi-insulating layer and penetrating an effective distance into the semi-insulating layer through a window in a photoresist layer which is implaced atop the transistor structures, the window opening being between an n-type transistor and a p-type transistor.

6. A partially planar process for fabricating at least one n-type MESFET transistor and at least one p-type MODFET transistor comprising:
    forming a first layer of intrinsic GaAs of a thickness of from about 1 to about 5 microns on a first surface of a semi-insulating wafer by molecular beam epitaxy (MBE);
    forming a second layer of undoped AlGaAs of a thickness of from about 50 to about 100 Angstroms atop the first layer by MBE;
    forming a third layer of p-type AlGaAs of a thickness of from about 300 to about 500 Angstroms atop the second layer by MBE;
    forming a fourth cap alyer of p+ AlGaAs having a p-type impurity concentration of about 10$^{18}$cm$^{-3}$ atop the third layer by MBE;
    establishing the channel region of the n-type transistor by ion implantation on n-type impurity ions through a fifth layer of Si$_3$N$_4$ of about 500 to about 1,000 Angstroms thickness to establish the channel in the first layer of gallium arsenide;
    striping away the fifth layer;
    forming gate electrodes of a refractory metal compound for the n- and p-type transistors;
    etching away all of the fourth cap layer, the third layer, the second layer and the first layer down to the first surface of the semi-insulating area in all areas except those directly underneath the gate electrode of the refractory metal compound for the n- and p-type transistors;
    establishing source and drain regions for the n- and p-type transistors by ion implantation of respective n- and p-type impurities through a sixth Si$_3$N$_4$ layer having an effective thickness similar to the fifth layer;
    annealing the structure at about 800° C. for about 1–10 minutes; and
    depositing electrode metallizations atop the respective source and drain regions of the n- and p-type transistors.

7. The process of claim 6 wherein the wafer is a silicon wafer.

8. The process of claim 6 wherein the wafer is a GaAs wafer.

9. The process of claim 6 wherein the relative proportions of Al and Ga in the AlGaAs layers are defined by th formulate Al$_x$Ga$_{1-x}$As where x is at least 0.3.

* * * * *